United States Patent [19]

Khoury

[11] Patent Number: 5,345,119
[45] Date of Patent: Sep. 6, 1994

[54] CONTINUOUS-TIME FILTER TUNING WITH A DELAY-LOCKED-LOOP IN MASS STORAGE SYSTEMS OR THE LIKE

[75] Inventor: John M. Khoury, New Providence, N.J.

[73] Assignee: AT&T Bell Laboratories, Murray Hill, N.J.

[21] Appl. No.: 943,336

[22] Filed: Sep. 16, 1992

[51] Int. Cl.⁵ ................... H03K 5/00; G11B 5/596
[52] U.S. Cl. ................... 307/521; 328/167; 360/78.14
[58] Field of Search ........... 307/521, 520; 328/167; 360/78.14

[56] References Cited

U.S. PATENT DOCUMENTS

| 4,509,019 | 4/1985 | Banu et al. | 330/107 |
| 4,894,734 | 1/1990 | Fischler et al. | 360/51 |
| 4,945,311 | 7/1990 | Smith | 328/167 |
| 5,182,478 | 1/1993 | Nomura | 307/521 |

OTHER PUBLICATIONS

"LC²MOS Complete Embedded Servo Front Ends for HDD", *Analog I/O Ports*, REV.O. Analog Devices Preliminary Technical Data pp. 8–43 through 8–62 (date unknown).
"Disk Interface Design Guide and Users Manual", *National Semiconductor Application Note 413, AN-413*, J. Cecil, R. Gopalan, W. Llewellyn, S. Masood, P. Tucci, L. Wakeman pp. 9–3 through 9–46 (date unknown).

*Primary Examiner*—Andrew M. Dolinar
*Attorney, Agent, or Firm*—Scott W. McLellan

[57] ABSTRACT

A delay-locked-loop (DLL) controls the cutoff frequency of a filter in an exemplary mass storage servo control channel. The cutoff frequency is adjusted in response to a clock pulse which updates the DLL. Between pulses, the DLL holds its value, reducing power consumption. The DLL has a fixed delay (precision) and a variable delay cell producing two delayed outputs, one output a predetermined amount after the other output. The DLL locks the delayed pulses from the variable delay cell to straddle a delayed pulse from the precision delay. The filter has selectable resistors and capacitors for adjusting the frequency thereof. Substantially identical selectable resistors and fixed capacitors are in the variable delay cell. The DLL selects which resistors in the variable delay cell (and corresponding resistors in the filter) results in the straddled delayed pulses. The capacitors in the filter are selected for the approximate desired cutoff frequency of the filter.

6 Claims, 5 Drawing Sheets

CONTINUOUS-TIME FILTER TUNING WITH A DELAY-LOCKED-LOOP IN MASS STORAGE SYSTEMS OR THE LIKE

BACKGROUND OF THE INVENTION

1. Field of the Invention

This invention relates to tunable filters generally and, more particularly, to an apparatus for tuning a filter disposed on an integrated circuit.

2. Description of the Prior Art

Servo filters arc used in the read channel of mass storage systems, such as magnetic disk media systems, to filter servo data patterns recorded on media to facilitate read/write head tracking. The servo data patterns are typically embedded in the data patterns recorded on the media. The filter, typically a low pass filter, has a cutoff frequency that is set for a given system.

It is desirable to implement the filter and its associated tuning circuitry in a common integrated circuit. Prior art tuning techniques typically rely on a phase-locked-loop (PLL) arrangement, such as that discussed in U.S. Pat. No. 4,509,019, assigned to the same assignee as this invention, and incorporated herein by reference. However, PLLs continuously dissipate power to maintain the filter's cutoff frequency even when the filter is not being used. If the reference signal (to which the PLL is locked) is removed, then the PLL drifts to a nominal frequency, changing the characteristic frequency of the filter along with it. This may be undesirable in many instances.

Thus, it may be desirable to maintain a desired filter characteristic without dissipating significant power when the filter is not being adjusted.

It is also desirable to have the filter characteristics remain substantially constant for relatively long periods without having to continually track the filter to a reference signal.

SUMMARY OF THE INVENTION

These and other aspects of the invention may be accomplished generally with a tunable filter having a characteristic frequency substantially determined by a combination of capacitance and resistance, the amount of the combination being determined by a control signal. The tunable filter is characterized by a reference network, responsive to a first signal, for asserting a reference signal at a time after assertion of the first signal; and means, responsive to the first signal and the reference signal, for producing the control signal. The control signal is updated in response to the first signal and remains substantially constant between assertions of the first signal.

BRIEF DESCRIPTION OF THE DRAWING

The foregoing features of this invention, as well as the invention itself, may be more fully understood from the following detailed description of the drawings, in which.

DETAILED DESCRIPTION

Figure 2:
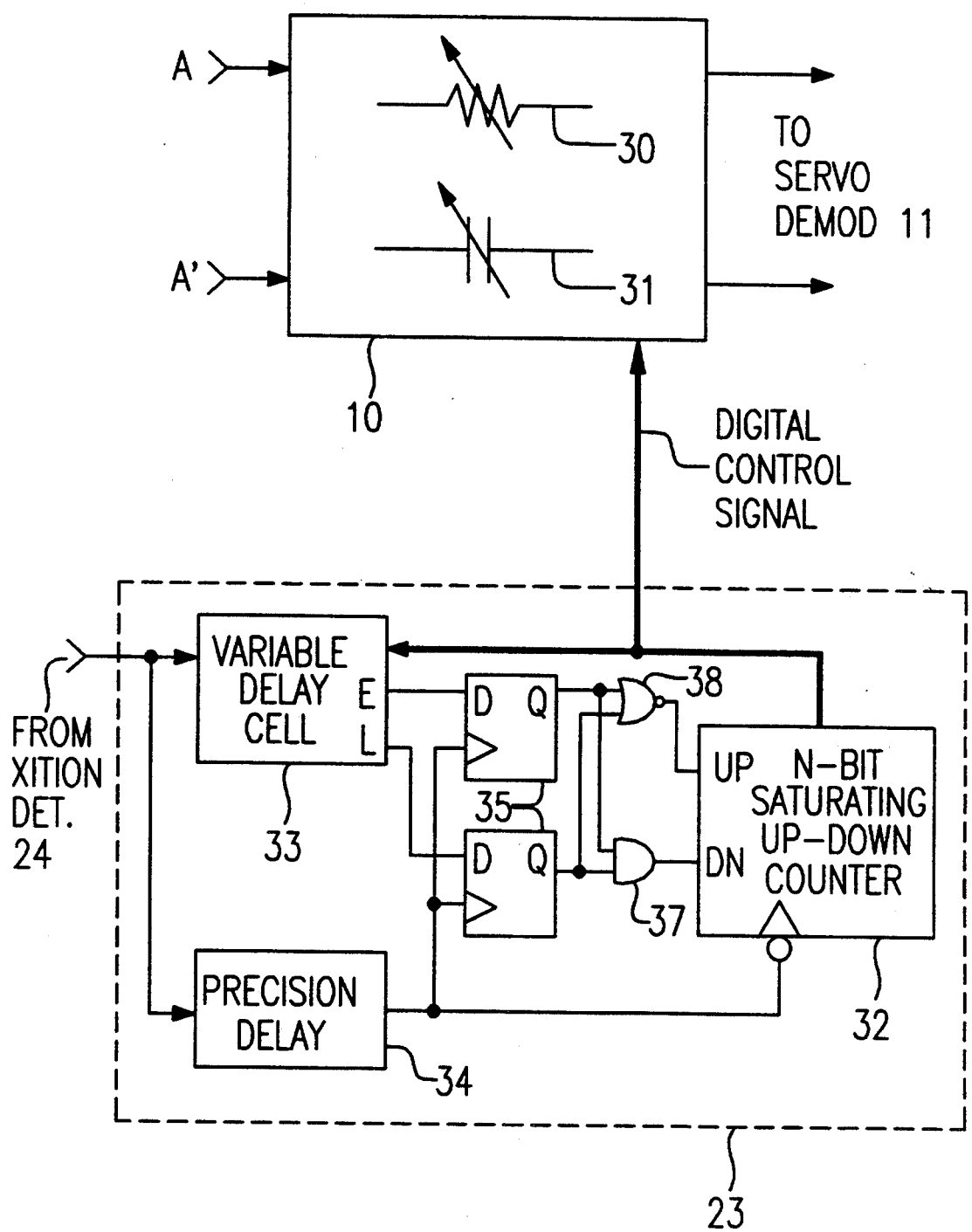
FIG. 2 is a simplified block diagram of the tuning control for the tunable servo filter shown in FIG. 1, according to one aspect of the invention.

In FIG. 2, an exemplary embodiment of the invention is shown. Generally, a tunable filter 10 has a characteristic frequency substantially determined by a combination of capacitance and resistance therein, the combination being determined by a control signal from a tuning control circuit 23 controlling a resistance. The tuning control circuit 23 has a reference network (precision delay 34, responsive to a first signal (from a transition detector 24), for asserting a reference signal a time after assertion of the first signal. Means (variable delay cell 33, flip-flops 35, gates 37, 38, and counter 32), responsive to the first signal reference signal, for producing the control signal. The control signal is updated in response to the first signal and remains substantially constant between assertions of the first signal.

Figure 1:
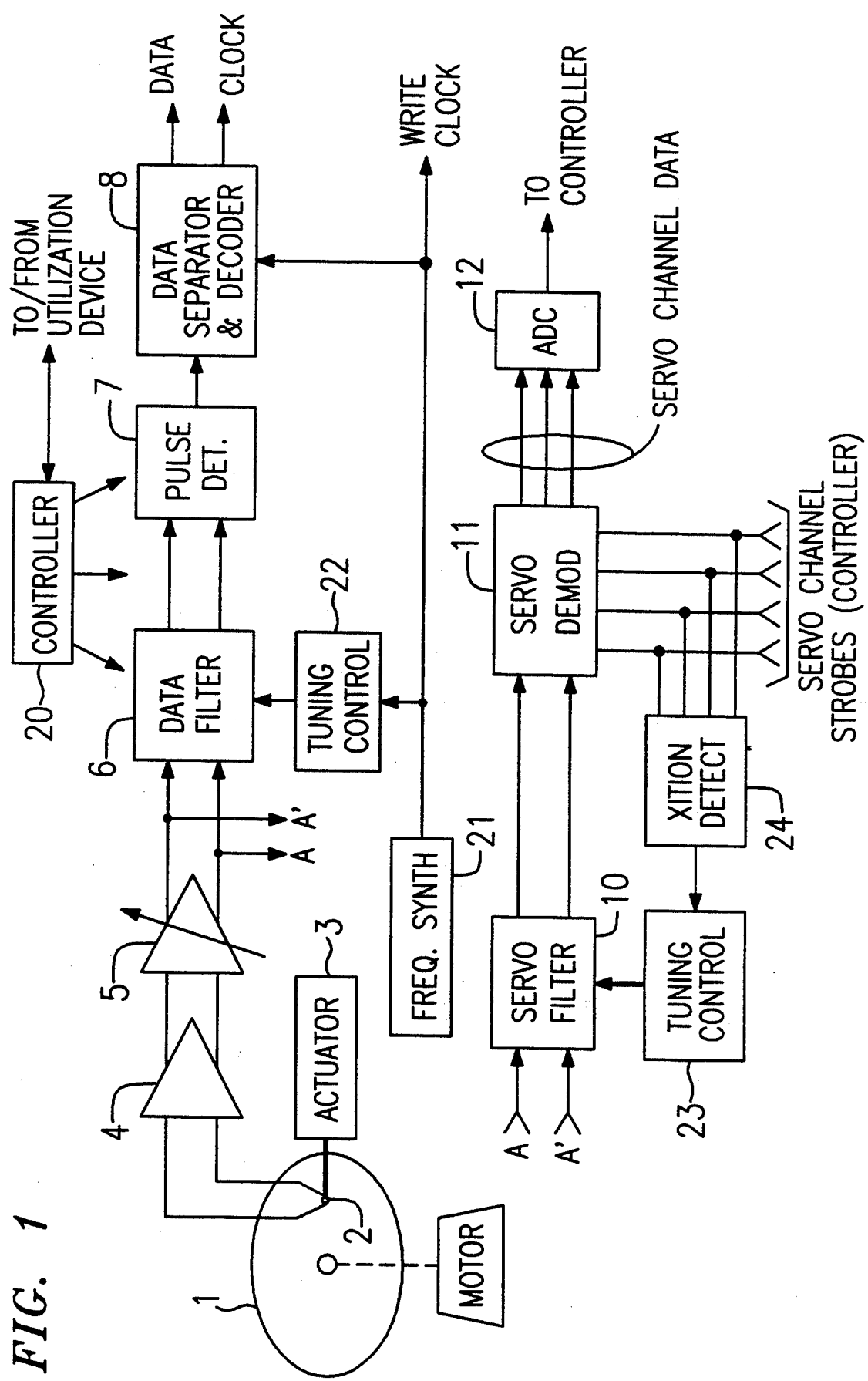
FIG. 1 is a simplified block diagram of a read channel in a mass storage system utilizing the invention.

The invention may be understood more generally by referring to FIG. 1, a generalized block diagram of the read channel in a mass storage (e.g. magnetic disk) system. More detailed discussion of the operation of a typical mass storage system may be found in Application Note AN-413 by National Semiconductor (1989). For purposes here, the discussion of the mass storage system will be limited to an overview of the read channel portion thereof.

The mass storage system typically has a motor (not numbered) driving a magnetic media 1, such as a magnetizable disk. Data stored on the disk 1 is read by a head 2 positioned by an actuator 3, discussed in more detail below. Signals from the head 2 are first amplified by a preamplifier 4 and further amplified by a variable gain amplifier 5. The amplified signals then follow two paths, one for the data and one for servo control to keep the head centered on the desired track on the disk 1.

The amplified signals in the data path are first filtered by a data filter 6, and then the pulses there in are detected by pulse detector 7. Up to the detector 7, the signals are differential to increase the robustness to noise of the amplified low level signals from the head 2. The pulse detector 7 converts the differential signals to single-ended signals of predetermined pulse width for input to a dam separator and decoder 8. The separator and decoder 8 converts the detected pulses from detector 7 into dam and a clock signal for utilization by a computer, etc.

The amplified signals in the servo (head control) path are first filtered by filter 10 to enhance a substantially fixed frequency "servo pattern" recorded with the desired data. A servo demodulator 11 detects and demodulates the servo pattern channel data into analog form for each of the servo channels. The servo channel data is converted into digital form by analog-to-digital converter (ADC) 12 for further processing by controller 20.

Controller 20, typically a dedicated microprocessor or digital signal processor (DSP) responsive the utilization device (computer, etc.), controls the detailed operation of the mass storage system. In the context of the read channel operation, the controller moves the head 2 using the actuator 3 to the track on the disk 1 requested by the utilization device. To optimize the location of the head 2 over the desired track, the servo control path of filter 10, demodulator 11 and ADC 12 feeds back the servo data to the controller 20 which, in turn, fine-tunes the position of the head 2.

Most mass storage systems utilize what is known as "constant density recording" to increase the data storage capacity of the disk 1. This generally involves making the density of flux reversals on the disk 1 substantially constant between outer tracks and inner tracks on the disk 1. Typically, constant density recording is accomplished by changing the frequency at which data is written depending on which track on disk 1 is being used. The change in frequency generally involves the controller 20 programming a frequency synthesizer 21 to the desired write frequency. Because the read operation is complementary to the write operation, the frequency of the read data also changes with track location. Thus, the controller 20 programs the synthesizer 21 to the expected read data frequency before reading of the disk 1 occurs. The presetting of the synthesizer 21 allows the data separator and decoder 8 to quickly lock onto the detected data.

An additional requirement for the read channel circuits is the tracking of characteristic (low-pass cut-off) frequency of the data filter 6 with the frequency of the read data. For the data filter 6, a tuning control forces the characteristic frequency of the data filter 6 (in this case, the low-pass cut-off frequency of the filter) to track the frequency from the synthesizer 21, the approximate frequency of the read data.

Unlike the data filter 6, the servo filter 10 has a fixed cut-off frequency because the frequency of the servo patterns written on the disk 1 are substantially constant regardless of where they are written on the disk 1. As will be explained below, the servo filter 10 has a "coarse" low-pass cut-off frequency that is selectable by the controller 20. The actual cut-off frequency is fine-tuned to the desired frequency by tuning control circuit 23. Tuning control circuit 23 compensates for variations in fabrication processing and operating temperature which may make filter 10 deviate from the desired operating frequency. In this embodiment, the tuning control circuit 23 is not "updated" unless the servo demodulator 11 is clocked by controller 20. The control circuit 23 is updated when transition detector 24 detects a change in the control signals (strobes) to the demodulator 11 change. Thus, an important advantage of the invention is that the characteristics of servo filter 10 and the tuning control circuit 23 are not changed unless the servo path is being used, thereby reducing power consumption of the read channel.

In FIG. 2, the servo filter 10 and tuning control circuit 23 are shown in more detail. A representative diagram of servo filter 10 has representative variable resistors 30 and representative variable capacitors 31 to set the desired characteristic frequency of the filter 10. In this example, the servo filter 10 is a third order low-pass filter, the characteristic (low-pass cut-off) frequency thereof being substantially determined by (inversely proportional to) the product of the total resistance of the variable resistors 30 and the capacitance of variable capacitors 31 (RC product). The type and circuitry of individual sections making up the filter 10 may be of the type shown in the above-referenced U.S. Pat. No. 4,509,019, with one notable difference being that the variable resistances and capacitances used have discrete values, such as the resistors 30 and and capacitors 31 shown in FIG. 3.

Figure 3:
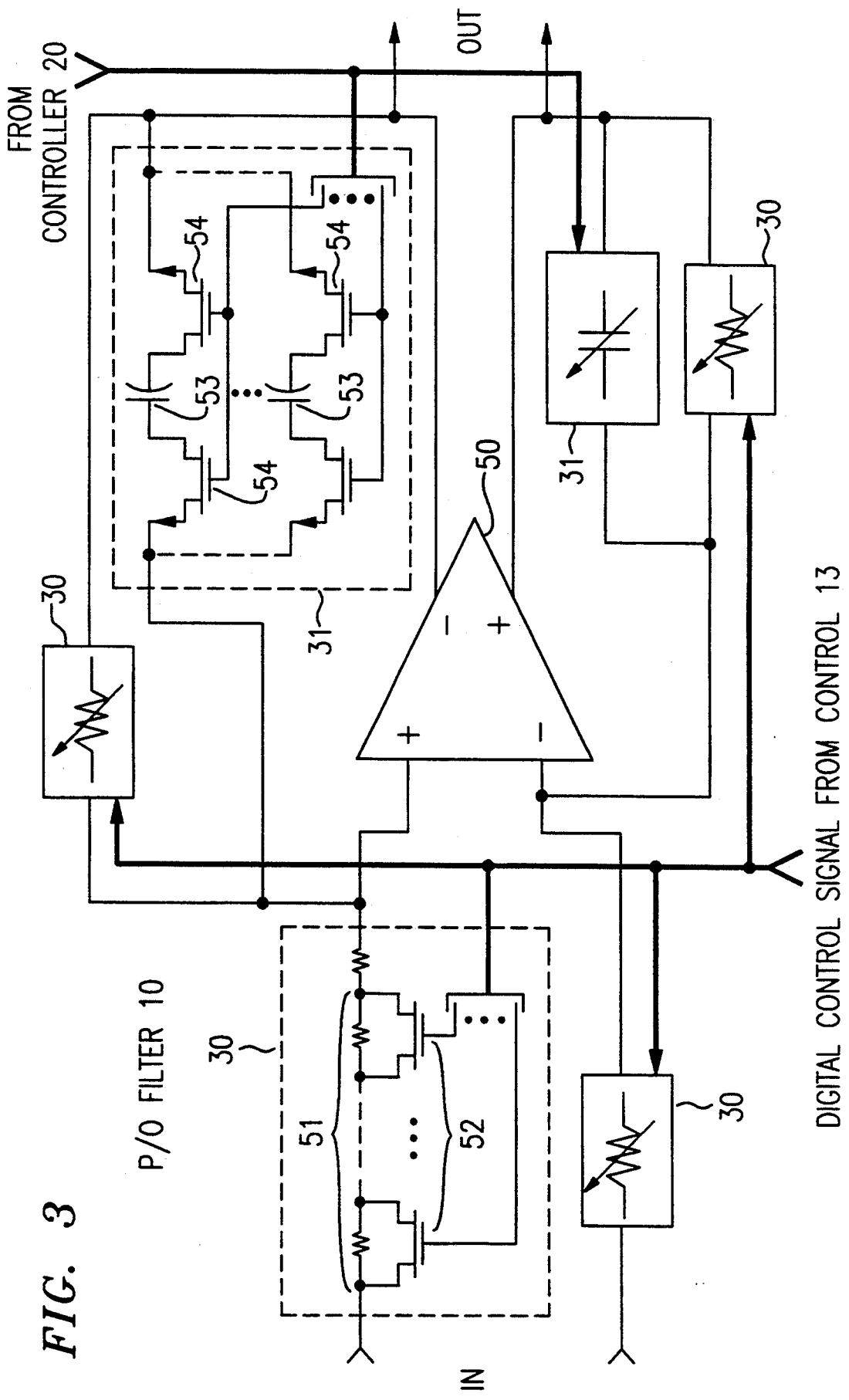
FIG. 3 is a simplified schematic diagram of an exemplary portion of the tunable servo filter circuit of FIG. 2.

Turning to FIG. 3, an exemplary stage in the filter 10 is shown. Preferably disposed in a common substrate are variable resistors 30, having discrete values, variable capacitors 31, also having discrete values, and an operational amplifier (opamp) 50. The variable resistor 30 has resistors disposed in series to form a resistor string 51. Corresponding transistor strings 52, acting as switches, bypass individual resistors in the string 51 to trim the total resistance value of the variable resistor 30 to a desired value. Similarly, the variable capacitors 31 have paralleled capacitors 53 with transistors 54 operating as switches to isolate unwanted capacitors 53. Although not shown, additional transistors may be added to shunt the unwanted capacitors to a common potential (e.g., ground) to reduce parasitic capacitance effects and distortion.

As stated above, the servo filter 10 in this example is a third order low-pass filter, the characteristic (low-pass cut-off) frequency thereof being substantially determined by the total resistance of variable resistors 30 and variable capacitors 31. The value of the variable resistors 30 are controlled by a digital control signal from filter control circuit 23 (FIGS. 1 and 2). The value of the variable capacitors 31 are determined by the controller 20 (FIG. 1 ) to set the "coarse" frequency setting of the filter 10 (FIG. 2) The filter 10 is "fine-tuned" to the desired frequency by the variable resistors 30 under control of the filter control circuit 23.

The resistors 51 in each variable resistor 30 are proportionally the same and, preferably, substantially the same. As stated above, corresponding gates between each of the transistor strings 52 are coupled together such that the total resistance of the variable resistors 30 are proportionally (preferably, substantially) the same and track each other. By forming all of the circuitry in the filter 10 (and the circuitry in the tuning control circuit 23, discussed below) in a common integrated circuit substrate, the characteristics of the filter sections will closely track each other as the transistors 52 are switched. Thus, the characteristics of filter 10 are changed by a digital control signal from the tuning control circuit 23. As will be discussed below, the values of the resistors 51 in variable resistors 30 are weighted to provide a binary conversion of the digital control signal to map the filter's characteristics to the digital control signal.

Returning to FIG. 2, the digital control signal is generated by a counter 32 which increments or decrements depending on a delay produced by variable delay cell 33 in reference to a precision delay 34. Counter 32 is a saturating counter, i.e., it does not underflow or overflow. Variable delay cell 33, flip-flops 35 gates 37, 38 and counter 32 form a means for adjusting the characteristics of filter 10, as will be discussed below.

Figure 4:
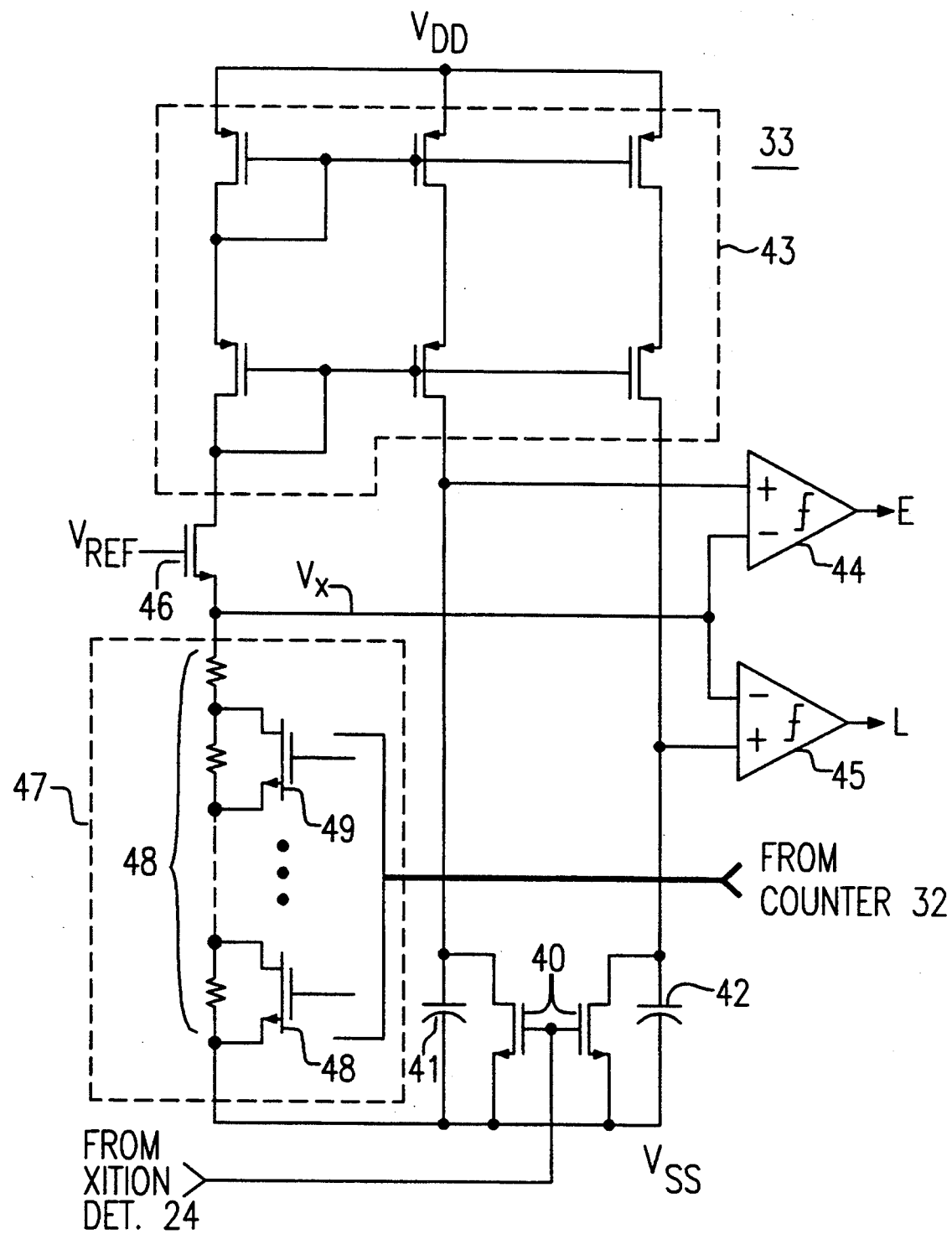
FIG. 4 is a simplified schematic diagram of an exemplary variable delay circuit used in the tuning control of FIG. 2.

A simplified schematic of the variable delay cell is shown in FIG. 4. The delay has therein two sections to provide an early (E) and late (L) delayed outputs in response to an input from the transition detector 24. Transistors 40 operate as switches to discharge the capacitors 41, 42. When transistors 40 open in response to the transition detector 24, capacitors 41, 42, charge up from current supplied by current mirror 43. When the voltage across the capacitors 41, 42 exceed a predetermined voltage (here, $V_x$), corresponding comparators 44, 45 switch state, providing a delayed pulse. In this embodiment, the current supplied to each capacitor 41, 42 from the current mirror 43 is substantially the same. The value of capacitor 42 is approximately an exemplary ten percent more than that of capacitor 41. Other capacitor scalings may be used with an understanding that the granularity (step size) of the digital control signal's effect on the filter 10 (FIG. 2) may have to be scaled appropriately. In addition, the values of capacitors 41, 42 may be the same and the current from the current mirror 43 to each capacitor 41, 42 made different to achieve the same result.

The current used to charge the capacitors 41, 42 is substantially determined by a discretely variable resistor 47 having a resistor string 48 and transistors 46, 49. The resisters 48 are matched to the resisters in string 51 in filter 10 (FIGS. 2, 3) and transistors 49 correspond to transistors 52 in filter 10 and are controlled by the same digital control signal from counter 32 (FIG. 2). Thus, the total resistance of the variable resisters 47 (FIG. 4) and 30 (FIG. 3) are proportionally the same and, preferably, substantially the same. The total resistance of the variable resisters 30, 47 are inversely proportional to the digital control signal, i.e., the higher the value of the control signal, the less resistance there is in the variable resisters 30, 47.

The current from the current mirror 43 is set by the resistance of the variable resistor 47 in combination with the voltage $V_{REF}$ (a substantially fixed voltage) on the gate of transistor 46. As the resistance of the resistor 47 changes, the current from the current mirror 43 changes. In effect, the delay through the variable delay cell 33 is directly proportional to the RC product of the resistance in the variable resistor 47 and capacitance of capacitors 41, 42. Because the characteristic frequency of the filter 10 (FIG. 2) is related (for a low pass filter, inversely proportional) to the RC product of the resistance of the resistor strings 30 and the capacitance of capacitors 31 (FIG. 2) therein, the delay through the cell 33 is related to the characteristic frequency of the filter 10. For a low-pass filter 10, the delay through variable delay cell 33 is inversely proportional to the cut-off frequency of the filter 10 and the cut-off frequency of filter 10 tracks the delay through the variable delay cell 33. This allows the control circuitry 23 to compensate for resistance and capacitance deviations in the filter 10 by forcing a match between the delay through the variable delay cell 33 to match a precision delay with resistor adjustments in both the filter 10 and the delay cell 33.

Figure 5:
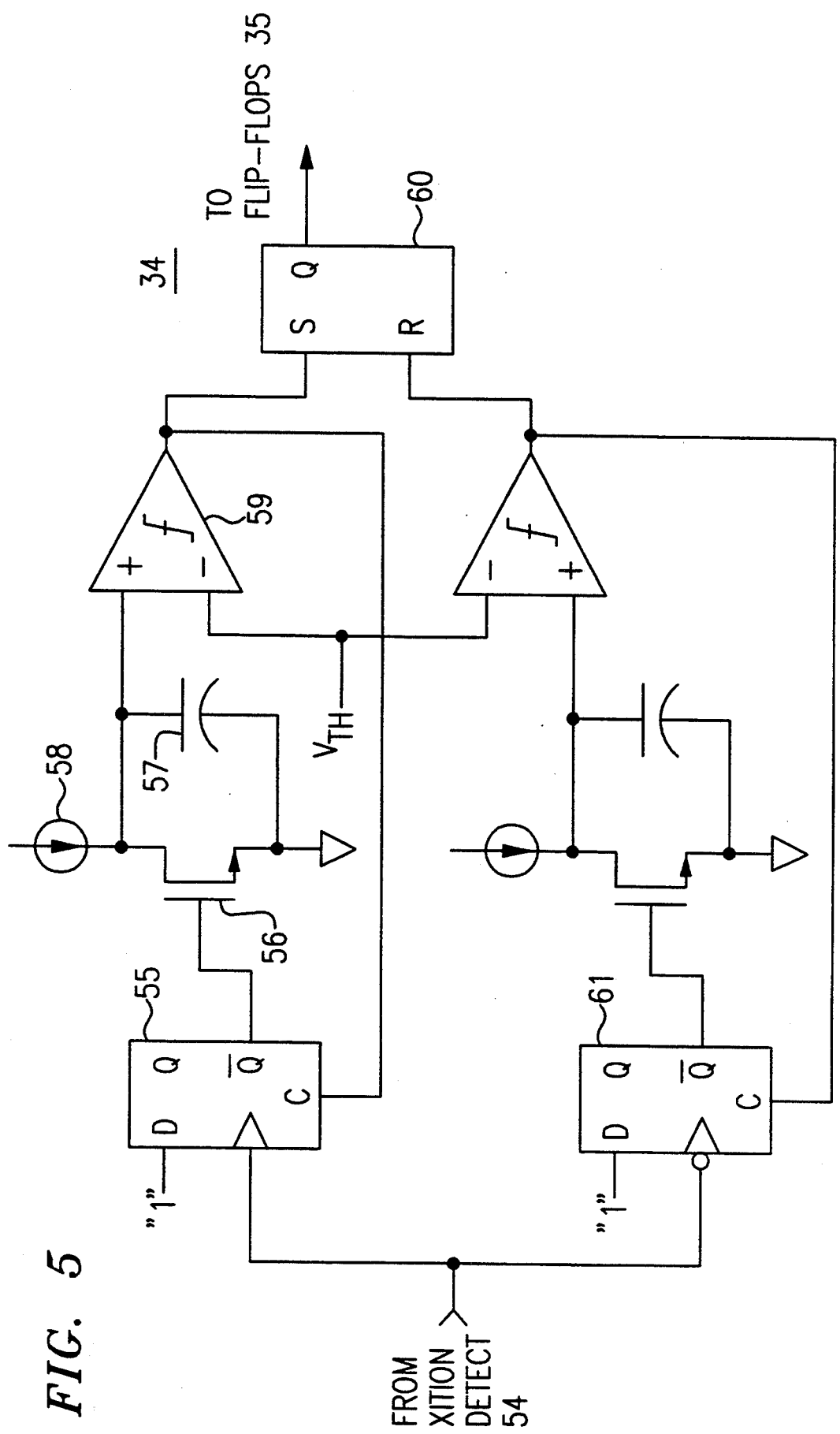
FIG. 5 is a simplified schematic diagram of an exemplary precision delay circuit used in the tuning control of FIG. 2.

In FIG. 2, a reference network of precision delay 34 provides the reference needed for proper adjustment of the filter 10. A simplified schematic diagram of an exemplary precision delay 34 is shown in FIG. 5. Briefly described, flip-flop 55 is triggered on the rising edge of a signal from transition detector 24 (FIG. 1) to turn-off transistor 56. This allows capacitor 57 to charge up until the voltage thereon exceeds $V_{TH}$, a predetermined threshold voltage, triggering the output of comparator 59 to set S-R latch 60. Setting latch 60 then clears flip-flop 55, discharging capacitor 57. The delay from the transition in the input to flip-flop 55 to the assertion of the output from flip-flop 60 is substantially determined by the current from the current source 58, the capacitance of capacitor 57, and the voltage $V_{TH}$. this example, the delay is about 180 ns. Preferably, the precision delay is adjusted at manufacture to the desired delay using programmable links, laser blown fuses, etc. trimming the charging current 58. Corresponding flip-flop 61 is triggered by a falling edge in the input signal from the detector 24 through delay circuitry, corresponding to the circuitry described above, to reset latch 60. In this example, the need for a delay in resetting latch 60 may not be necessary and other methods for resetting the latch 60 may be used.

Returning to FIG. 2, operation of the tuning control circuit 23 is described. When a transition in the servo channel strobes (FIG. 1) is detected by the transition detector 24, the variable delay cell 33 and precision delay 34 are triggered. After a fixed amount of time as determined by the precision delay 34, flip-flops 35 are clocked, sampling the outputs E and L from the variable delay cell 33. If, at the time of clocking of the flip-flops 35, both the early (E) and late (L) outputs of the variable delay cell are "low" (indicating that the variable delay therein is too long), NOR gate 38 forces the counter 32 to increment, shortening the delay. If, however, at the time of clocking both both the E and L outputs are "high" (indicating that the delay of the variable delay cell is too short), AND gate 37 forces counter 32 to decrement, lengthing the delay by cell 33. Thus, the control circuit 23 forms a delay-locked-loop (DLL) in which the control circuit 23 is "locked" when the E output is "high" and the L output is "low" (the delayed pulses "straddle" the precision delayed pulses) when the flip-flops 35 are clocked by the precision delay 34. The counter 32 then "holds" at the present count. Then the RC product of the variable delay cell 33 matches the reference delay of precision delay 43 and the cutoff frequency of filter 10 is trimmed to the desired frequency.

To avoid "hunting" or oscillation by the tuning control circuit 23, the change in total delay of either output E, L for each increment or decrement of counter 32 should be less than the difference in delay between the E and L outputs.

It is understood that other circuit designs for the filter 10 may be used, such as high-pass, band-pass, etc. depending on the application. Filter characteristics that may be controlled by the invention include center frequency, Q, gain, etc. In addition, digital control of the filter 10 may be accomplished with analog signals using a digital-to-analog converter to convert the digital control signal from the counter 32 to analog form for application to the filter 10 and, if desired, the variable delay cell 33.

In addition, it is understood that the invention may be practiced by interchanging the control signals to the capacitors 31, 42 (capacitors 42 being suitably adapted to be responsive to a control signal) and the resistors 30, 47. Capacitors 31, 42 will then be responsive to the tuning control circuit 23 and the resistors 30, 47 will then be responsive to the controller 20. Thus, the combination of capacitors and resistors may be controlled by the tuning control circuit 23 controlling either the variable resistors or variable capacitors.

Further, this invention may be applied to other applications besides in mass storage read channels, such as high definition television systems.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

I claim:

1. A tunable filter having a characteristic frequency substantially determined by a combination of capacitance and resistance, the amount of the combination being determined by a control signal;

CHARACTERIZED BY:

a reference network, responsive to a first signal, for asserting a reference signal at a time after assertion of the first signal;

a variable delay cell, for asserting first and second delayed signals after the assertion of the first signal, the amount of delay being proportional to the combination of capacitance and resistance determined by the control signal, and the delay of the second delayed signal being proportionally greater than the delay of the first delayed signal; and a comparator for comparing the first and second delayed signals to the reference signal to generate the control signal;

wherein the comparator adjusts the control signal such that the reference signal occurs after the assertion of the first delayed signal and before the assertion of the second delayed signal, and the control signal remains substantially constant between assertions of the first signal.

2. The tunable filter as recited in claim 1, the comparator being further characterized by:

first and second storing means, each having an output, for storing the value of the first and second delayed signals when the reference signal is asserted; and counting means, responsive to the outputs of the storing means, for incrementing or decrementing the control signal value in response to the reference signal.

3. The tunable filter as recited in claim 2, wherein the counting means includes a saturating counter.

4. The tunable filter as recited in claim 3, wherein the reference network is a precision delay cell.

5. The tunable filter as recited in claim 3, wherein at least the filter, variable delay cells, and precision delay cell are formed in a common integrated circuit.

6. The tunable filter as recited in claim 3, wherein the filter is a servo channel filter in a magnetic media read channel circuit.

* * * * *